United States Patent
Zhang et al.

(10) Patent No.: US 9,342,246 B2
(45) Date of Patent: *May 17, 2016

(54) HOST COMMAND BASED READ DISTURB METHODOLOGY

(71) Applicant: Seagate Technology LLC, Cupertino, CA (US)

(72) Inventors: Zhiqing Zhang, JiangSu (CN); Yuan Chen, Shanghai (CN); Yun Shun Tan, Shanghai (CN); Xing Hui Duan, Shanghai (CN); Lin Feng Chen, Shanghai (CN)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/743,364

(22) Filed: Jun. 18, 2015

(65) Prior Publication Data

US 2015/0286407 A1      Oct. 8, 2015

Related U.S. Application Data

(63) Continuation of application No. 13/855,116, filed on Apr. 2, 2013, now Pat. No. 9,092,310.

(30) Foreign Application Priority Data

Mar. 15, 2013      (CN) .......................... 2013 1 0082519

(51) Int. Cl.
   *G06F 12/00*      (2006.01)
   *G06F 3/06*      (2006.01)
   *G06F 12/02*      (2006.01)
   *G11C 16/34*      (2006.01)

(52) U.S. Cl.
   CPC .............. *G06F 3/061* (2013.01); *G06F 3/0659* (2013.01); *G06F 3/0679* (2013.01); *G06F 12/00* (2013.01); *G06F 12/0246* (2013.01); *G11C 16/3427* (2013.01); *G11C 16/3431* (2013.01); *G06F 2206/1014* (2013.01); *G06F 2212/7202* (2013.01); *G06F 2212/7208* (2013.01); *G06F 2212/7211* (2013.01)

(58) Field of Classification Search
   CPC ..... G06F 3/061; G06F 3/0659; G06F 3/0679; G06F 12/0246; G06F 12/00; G11C 16/3427; G11C 16/3431
   USPC ................. 711/154, 148, 156, 158, 165, 103; 365/185.02, 185.33
   See application file for complete search history.

(56) References Cited

U.S. PATENT DOCUMENTS

| | | | |
|---|---|---|---|
| 4,127,901 A | 11/1978 | Horne et al. | 365/205 |
| 7,818,525 B1 | 10/2010 | Frost et al. | 711/165 |
| 8,060,797 B2 | 11/2011 | Hida et al. | 714/704 |
| 8,189,379 B2 | 5/2012 | Camp et al. | 365/185.02 |
| 8,190,842 B2 | 5/2012 | Frost et al. | 711/165 |
| 8,219,861 B2 | 7/2012 | Hida et al. | 714/723 |
| 8,275,931 B2 | 9/2012 | Yeh | 711/103 |

(Continued)

*Primary Examiner* — Stephen Elmore
(74) *Attorney, Agent, or Firm* — Christopher P. Maiorana, PC (57) ABSTRACT

An apparatus comprising an interface and a control circuit. The interface may be configured to process a plurality of read/write operations to/from a memory. The control circuit may be configured to determine if a read disturb has occurred. If the read disturb has occurred, the control circuit may (a) determine a size of a group of the read/write operations and (b) write all of the group of the read/write operations to one of a plurality of memory modules of the memory.

20 Claims, 6 Drawing Sheets

(56) References Cited

U.S. PATENT DOCUMENTS

| | | |
|---|---|---|
| 8,386,700 B2 | 2/2013 | Olbrich et al. ............... 711/103 |
| 8,453,022 B2 | 5/2013 | Katz .......................... 714/719 |
| 8,730,721 B2 | 5/2014 | Camp et al. ............. 365/185.02 |
| 9,086,954 B2* | 7/2015 | Yeh .................... G06F 12/0246 |
| 2011/0161554 A1 | 6/2011 | Selinger et al. ............. 711/103 |
| 2012/0084504 A1 | 4/2012 | Colgrove et al. ............ 711/114 |
| 2012/0084505 A1 | 4/2012 | Colgrove et al. ............ 711/114 |
| 2013/0060994 A1 | 3/2013 | Higgins et al. ............... 711/103 |
| 2014/0108703 A1 | 4/2014 | Cohen et al. ................. 711/103 |
| 2014/0136884 A1 | 5/2014 | Werner et al. ............... 714/6.11 |
| 2014/0164881 A1 | 6/2014 | Chen et al. ................... 714/773 |
| 2014/0173239 A1 | 6/2014 | Schushan .................... 711/165 |
| 2014/0281260 A1 | 9/2014 | Peterson et al. ............. 711/135 |

* cited by examiner

READ LPN0-7, LPN5 TRIGGERS THE READ DISTURB HANDLING

| | BLOCK X OF DIE 0 | BLOCK X OF DIE 1 | BLOCK X OF DIE 2 | BLOCK X OF DIE 3 |
|---|---|---|---|---|
| PAGE A | LPN 0 | LPN 2 | LPN 4 | |
| PAGE B | LPN 3 | LPN 5 | LPN 6 | |
| PAGE C | LPN 1 | ... | LPN 7 | ... |

RDD TRIGGERED LPNS

THEN, REWRITE THE LPN4-7 TO RECOVER THEM SEQUENTIALLY, LPN4 MIGHT NOT REWRITE DEPENDING ON WHETHER THE DATA BUFFER IS RELEASED OR NOT

| | BLOCK X OF DIE 0 | BLOCK X OF DIE 1 | BLOCK X OF DIE 2 | BLOCK X OF DIE 3 |
|---|---|---|---|---|
| PAGE A | LPN 0 | LPN 2 | LPN 4 | |
| PAGE B | LPN 3 | LPN 5 | LPN 6 | |
| PAGE C | LPN 1 | ... | LPN 7 | ... |
| ... | ... | ... | ... | ... |
| PAGE Y | LPN 4 | LPN 5 | LPN 6 | LPN 7 |

OLD PLACE, BECOMES GARBAGE AFTER RDD HANDLING
 NEW PLACE
 POSSIBLE TO MOVE

HOST COMMAND BASED READ DISTURB METHODOLOGY

This application relates to U.S. Ser. No. 13/855,116, filed Apr. 2, 2013, now U.S. Pat. No. 9,092,310, which relates to Chinese Application No. 201310082519.4, filed Mar. 15, 2013, each of which is incorporated by reference in their entirety.

FIELD OF THE INVENTION

The invention relates to storage devices generally and, more particularly, to a method and/or apparatus for implementing a host command based read disturb methodology.

BACKGROUND

In a conventional solid state drive, a logical sector is not always mapped to a fixed physical address. The physical address of a logical sector may change after a number of host write commands, wear leveling, read disturb handling or other operations. After these operations, some logical sequential addresses might not be sequential in the physical layer. In such a case, the host sequential read rate might drop to a fairly low performance because the maximum bandwidth of NAND Flash could not be used. Once performance drops, it is difficult to find a low cost way and suitable time to recover the lost bandwidth. Conventional read disturb detection (RDD) handlings are mostly based on the physical characteristics of the NAND Flash used to make the drive.

SUMMARY

The invention concerns an apparatus comprising an interface and a control circuit. The interface may be configured to process a plurality of read/write operations to/from a memory. The control circuit may be configured to determine if a read disturb has occurred. If the read disturb has occurred, the control circuit may (a) determine a size of a group of the read/write operations and (b) write all of the group of the read/write operations to one of a plurality of memory modules of the memory.

BRIEF DESCRIPTION OF THE FIGURES

Embodiments of the invention will be apparent from the following detailed description and the appended claims and drawings in which:

DETAILED DESCRIPTION OF THE PREFERRED EMBODIMENTS

Embodiments of the invention include providing a memory that may (i) provide a read disturb methodology, (ii) provide a host command based approach, (iii) increase performance, (iv) be useful in an application with large sequential read/write operations, such as a media server, (v) reduce write amplification, (vi) be implemented without the need for additional read operations, and/or (vii) be easy to implement.

Embodiments of the invention provide a methodology for implementing a read disturb process in a memory, such as the flash memory in a solid state drive (SSD). Data may be prevented from being scattered in the physical layer after implementing a read disturb process. Since data is not scattered, recovery of the data may be sequential in the physical layer, which may improve overall performance of the system.

Figure 1:
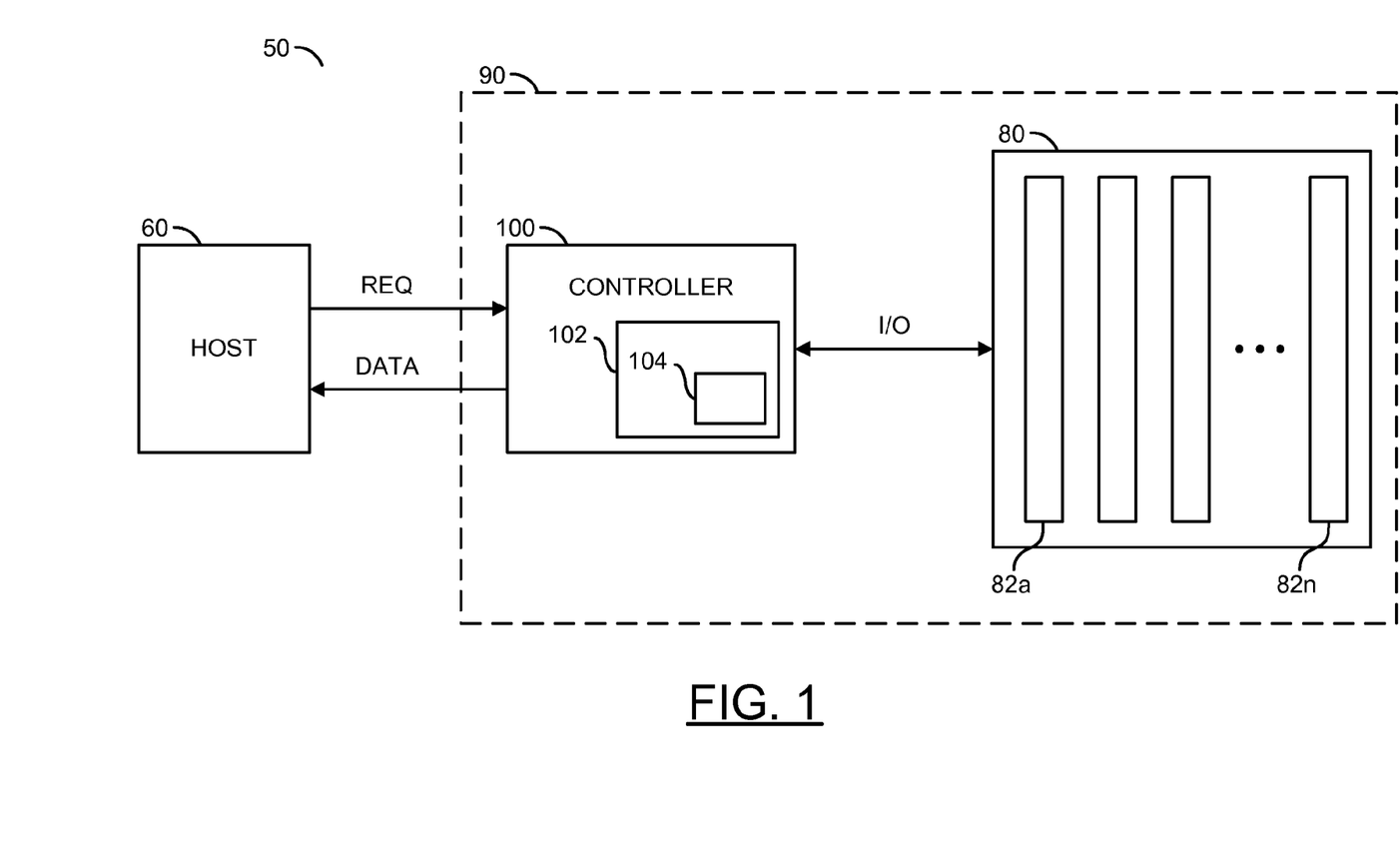
FIG. 1 is a block diagram of a context of embodiments of the invention.

Referring to FIG. 1, a block diagram of an example apparatus 50 is shown. The apparatus 50 generally comprises a block (or circuit) 60, a block (or circuit) 80 and a block (or circuit) 100. The circuit 100 may include a circuit 102. The circuit 102 may be a memory/processor configured to store computer instructions (or firmware). The instructions, when executed, may perform a number of steps. The firmware 102 may include a read disturb module 104 (to be described in more detail in connection with FIGS. 3 and 4).

A signal (e.g., REQ) may be generated by the circuit 60. The signal REQ may be received by the circuit 100. The signal REQ may be a request signal that may be used to access data from the circuit 80. A signal (e.g., I/O) may be generated by the circuit 100 to be presented to/from the circuit 80. The signal REQ may include one or more address bits. A signal (e.g., DATA) may be one or more data portions received by the circuit 60.

The circuit 60 is shown implemented as a host circuit. The circuit 100 reads and writes data to and from the circuit 80. The circuit 80 is generally implemented as a nonvolatile memory circuit. The circuit 80 may include a number of modules 82a-82n. The modules 82a-82n may be implemented as NAND flash chips. In some embodiments, the circuit 80 may be a NAND flash device. In other embodiments, the circuit 100 and/or the circuit 80 may be implemented as all or a portion of a solid state drive 90 having one or more nonvolatile devices. The circuit 80 is generally operational to store data in a nonvolatile condition. When data is read from the circuit 80, the circuit 100 may access a set of data (e.g., multiple bits) identified in the signal REQ.

In some embodiments, the circuit 80 may be implemented as a single-level cell (e.g., SLC) type circuit. An SLC type circuit generally stores a single bit per memory cell (e.g., a logical 0 or 1). In other embodiments, the circuit 80 may be implemented as a multi-level cell (e.g., MLC) type circuit. An MLC type circuit is generally capable of storing multiple (e.g., two) bits per memory cell (e.g., logical 00, 01, 10 or 11). In still other embodiments, the circuit 80 may implement a triple-level cell (e.g., TLC) type circuit. A TLC circuit may be able to store multiple (e.g., three) bits per memory cell (e.g., a logical 000, 001, 010, 011, 100, 101, 110 or 111).

Embodiments of the invention provide a method for detecting long retention. A VREF/channel tracking policy tracks pre-defined values of program/erase counts (PEC). The VREF parameter is tracked immediately after a program operation is stored, and used for retention detection. During retention detection, tracking is done and the result of the value of the signal VREF is compared to the stored value of the signal VREF immediately after programming. If the drift of a voltage threshold Vt is larger than a predefined threshold, a long retention is detected. In one example, when a long retention has been detected, a flag may be sent. Other types of indications to the controller 100 may be used to indicate that a long retention has been detected.

An optimal value for the signal VREF may be determined for a particular read operation. A dedicated procedure may be performed, generally called a retention test. A comparison of the value of the signal VREF may be made to the result of the value found immediately after the last erase/program operation is performed. If the signal VREF drifts down by a large amount, a long retention is detected. The retention detection leverages the results of the existing channel tracking module. An adjustment may be made on how the channel tracking procedure is triggered and/or how the optimal values of the signal VREF are stored. The adjustment may enable effective retention detection.

In general, the controller 100 may include an erase/program unit implemented in an R-block configuration. For example, multiple blocks may be read from multiple dies 82a-82n. Channel tracking of the signal VREF and/or the retention detection unit is also included in the R-block configuration. The erase/program unit may be implemented as part of the firmware 102. The channel tracking module 102 may track a distribution of the voltage threshold Vt for different states. Various channel parameters can be tracked, such as voltage threshold Vt mean, voltage threshold Vt variance and/or optimal values of the signal VREF.

The SSD drive 90 contains multiple NAND Flash dies (or memory modules) 82a-82n. The dies 82a-82n may operate to read or to write concurrently. The read and write bandwidth depends on how many of the dies 82a-82n are implemented, as well as the bandwidth of each of the dies 82a-82n.

If the SSD drive 90 receives a host command, in order to achieve the best performance, and to address wear leveling issues, the SSD drive 90 will walk through all of the dies 82a-82n (e.g., a first page of DIE0, DIE1, ..., DIEn, then a next page of DIE0).

Read disturb in a solid state drive 90 is one of the drawbacks caused by implementing NAND Flash. After many times reading one particular block, the block becomes unstable, and data stored in the block may no longer be accessible. As read disturb issues increase, eventually error correction (ECC) can not recover the data. The firmware 102 counteracts these drawbacks.

In general, the drive 90 records a read disturb count for every block. When a particular page of one of the blocks is read, the count increases by one. When the RDD count of one of the blocks exceeds a threshold, the drive 90 will start to move data in the block to some of the other available blocks.

Figure 2:
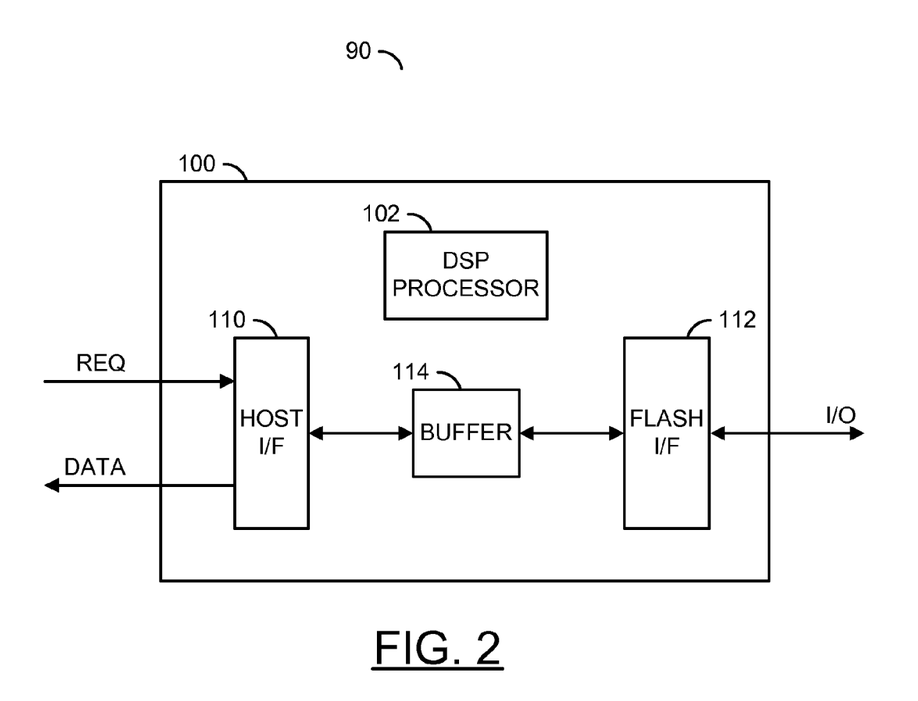
FIG. 2 is a more detailed diagram of the controller of FIG. 1.

Referring to FIG. 2, a more detailed diagram of the controller 100 is shown. The controller 100 shows the DSP processor/firmware 102, a block (or circuit) 110, a block (or circuit) 112 and a block (or circuit) 114. The circuit 110 may be implemented as a host interface. The circuit 112 may be implemented as a flash interface. The circuit 114 may be implemented as a buffer.

Figure 3:
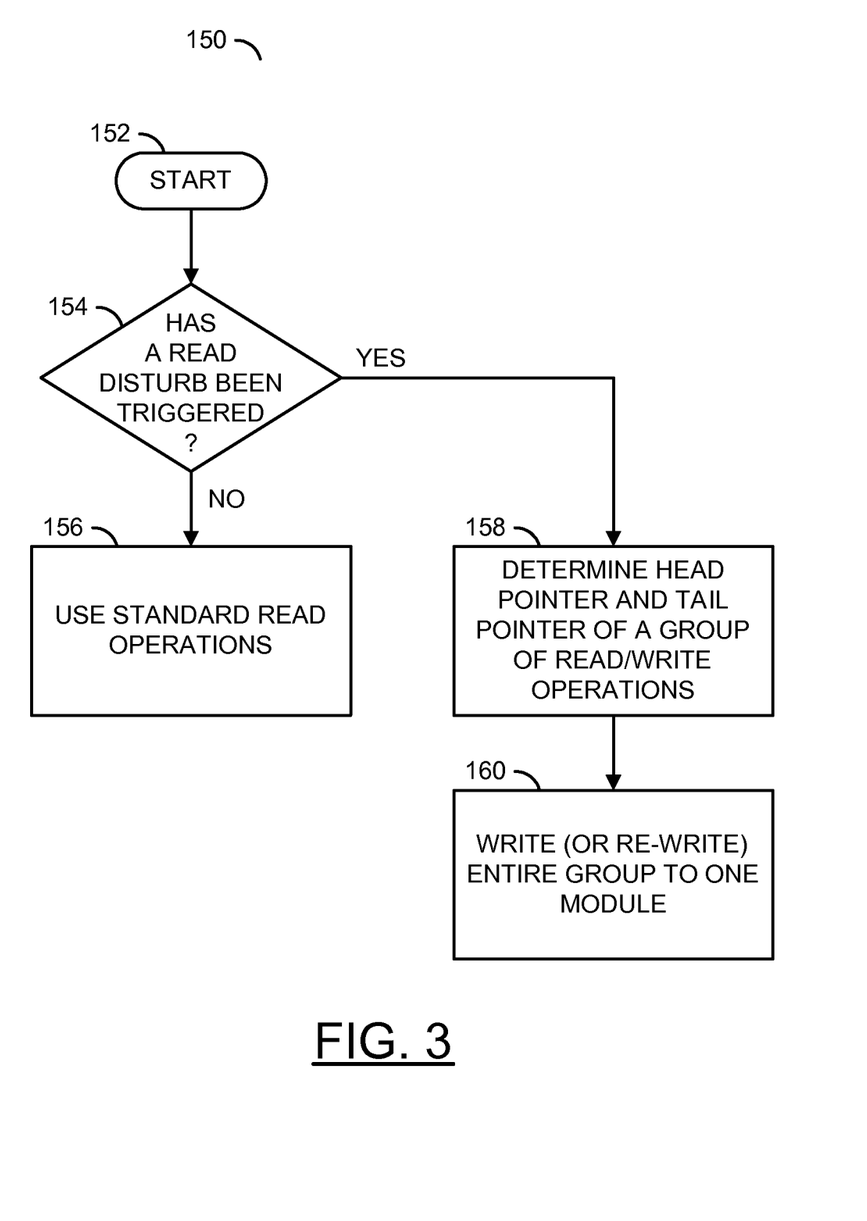
FIG. 3 is a flow diagram of a read disturb routine.

Referring to FIG. 3, a method (or process) 150 is shown. The process 150 may be implemented as part of the module 104. The process 150 generally comprises a step (or state) 152, a decision step (or state) 154, a step (or state) 156, a step (or state) 158 and a step (or state) 160. The step 152 may be a start state. The decision step 154 may determine if a read disturb has occurred. If so, the method 150 moves to the state 158. If not, the method 150 moves to the state 156. The state 156 implements standard read operations. The state 158 determines the size of the group of read/write operations by determining a head pointer and a tail pointer. The step 160 writes all of the group of read/write operations to one of the modules 82a-82n.

Figure 4:
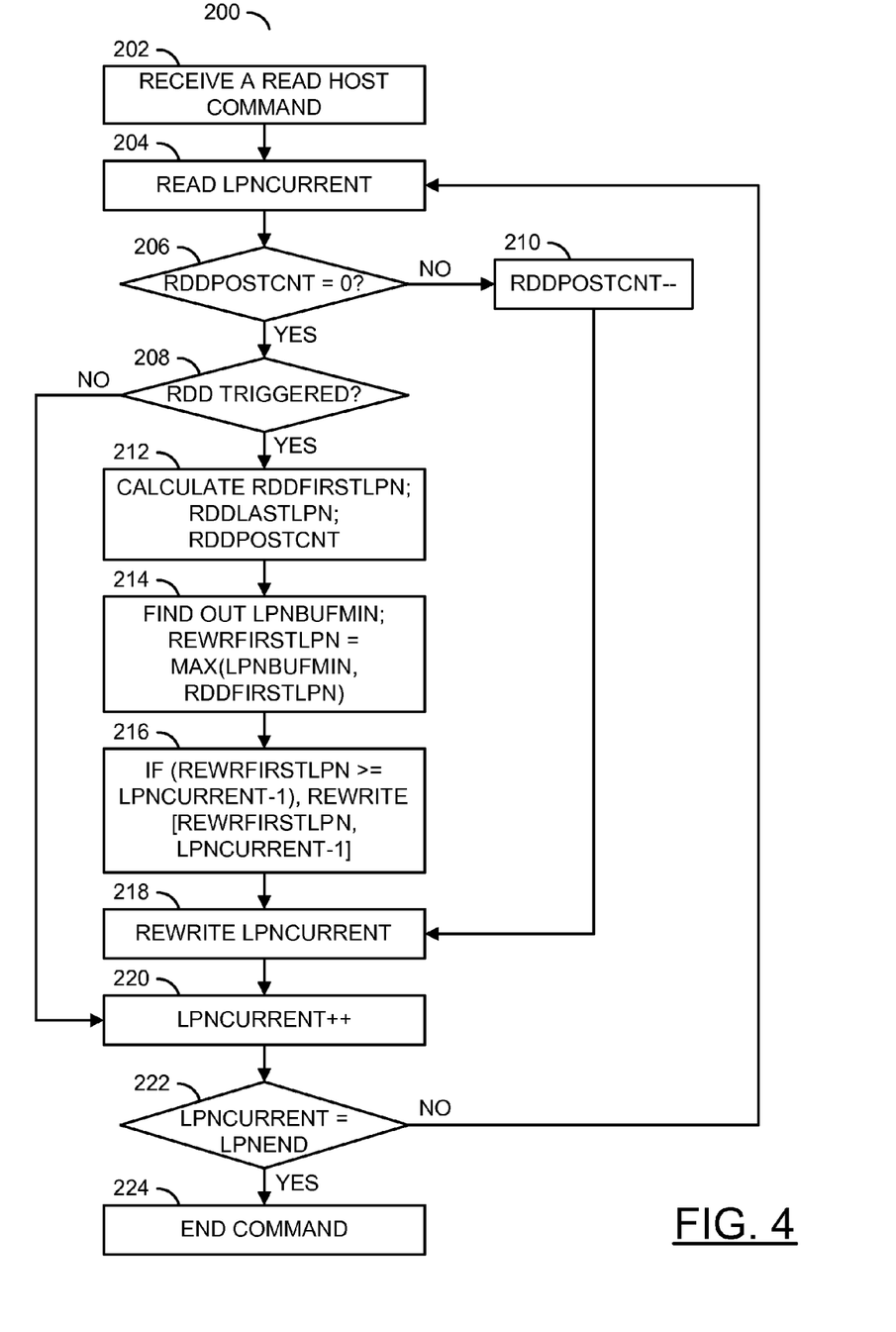
FIG. 4 is a more detailed flow diagram of a read disturb routine.

Referring to FIG. 4, a flow diagram of a method (or process) 200 is shown. A method 200 generally comprises a step (or state) 202, a step (or state) 204, a decision step (or state) 206, a decision step (or state) 208, a step (or state) 210, a step (or state) 212, a step (or state) 214, a step (or state) 216, a step (or state) 218, a step (or state) 220, a decision step (or state) 222, and a step (or state) 224.

The state LPNSTART generally represents a first logical page number (LPN) to be read by a host command. The state LPNEND generally represents a last LPN to be read by a host command. The state LPNCURRENT generally represents a current LPN to be read. The state LPNBUFMIN generally represents a minimum LPN whose buffer is valid. The state N generally represents a die count (e.g., the number of modules 82a-82n) of the drive 90. The state RDDPOSTCNT generally represents an LPN count to rewrite after the current LPN. The state LPNDIEFIRST generally represents a first LPN of the die boundary for LPNCURRENT. The state LPNDIELAST generally represents a last LPN of the die boundary for LPNCURRENT. The state RDDFIRSTLPN generally represents a first LPN to rewrite for the RDD by calculation. The state RDDLASTLPN generally represents a last LPN to rewrite for the RDD by calculation. The state REWRFIRSTLPN generally represents a first LPN to rewrite for the RDD.

The step 202 may receive a host read command. The state 202 also calculates the value LPNSTART and the value LPNEND, then initializes the value LPNCURRENT to be LPNSTART and RDDPOSTCNT equal to zero. The step 204 may read a value LPNCURRENT. The decision state 206 may determine if the signal RDDPOSTCNT is equal to zero. If so, the method 200 moves to the decision state 208. If not, the method 200 moves to the state 210. In the state 210, the method 200 decrements the value RDDPOSTCNT by two, then moves to the state 218. The decision state 208 determines if a read disturb operation has been triggered. If so, the method 200 moves to the state 212. If not, the method 200 moves to the state 220. In the state 212, the method 200 calculates a value RDDFIRSTLPN, a value RDDLASTLPN and a value RDDPOSTCNT.

Next, the method 200 moves to the state 214. In the state 214, the method 200 determines a value of the signal LPNBUFMIN, then sets a value REWRFIRSTLPN equal to MAX (LPNBUFMIN, RDDFIRSTLPN). Next, the method 200 moves to the state 216. In the state 216, the method 200 determines if the value REWRFIRSTLPN is greater than or equal to a value LPNCURRENT−1. The method 200 then rewrites the value REWRFIRSTLPN to be LPNCURRENT−1. Next, the method 200 moves to the state 218, where the value LPNCURRENT is rewritten. Next, the method 200 moves to the state 220, where the value LPNCURRENT is incremented twice. Next, the method 220 sets a number of parameters. In the state 222, the method 200 determines if the value LPNCURRENT is equal to LPNEND. If so, the method 200 moves to the state 224 and the method 200 ends. If not, the method 200 moves to the state 204.

A read disturb process is normally handled based on the physical characteristics of the memory 80. When the read disturb module 104 is triggered, all of the data in a particular block is read, then rewritten to other blocks. The write operation uses all of the dies 82a-82n during a host write. To move one block of data will often take a fairly long time. To avoid long latency for processing host commands, the memory 80 usually just moves the LPNs that trigger the RDD handling. The read disturb trigger count should be smaller than the real NAND specific RDD trigger count. From the view of logical address, the logical contiguous data may have some relation. For example, the read count for contiguous LPNs is very likely to have a similar read count.

If one host command writes to a range of one or more logical sequential LPNs, the LPNs likely have some connection (e.g., all in one single file, etc.). There is a likelihood that the host 60 will send another single command to read the same range of LPNs. If one of the LPNs reaches a read disturb limitation, then the others are very likely to also achieve the read disturb limitation.

The RDD count is recorded based on physical blocks. For a host read command, the RDD count might read a couple of LPNs. Without the module 104, all of LPNs of one read command will not always be triggered by the RDD handling at the same time. Without the module 104, after one RDD handling, the LPNs for one host command might be scattered.

Figure 5:
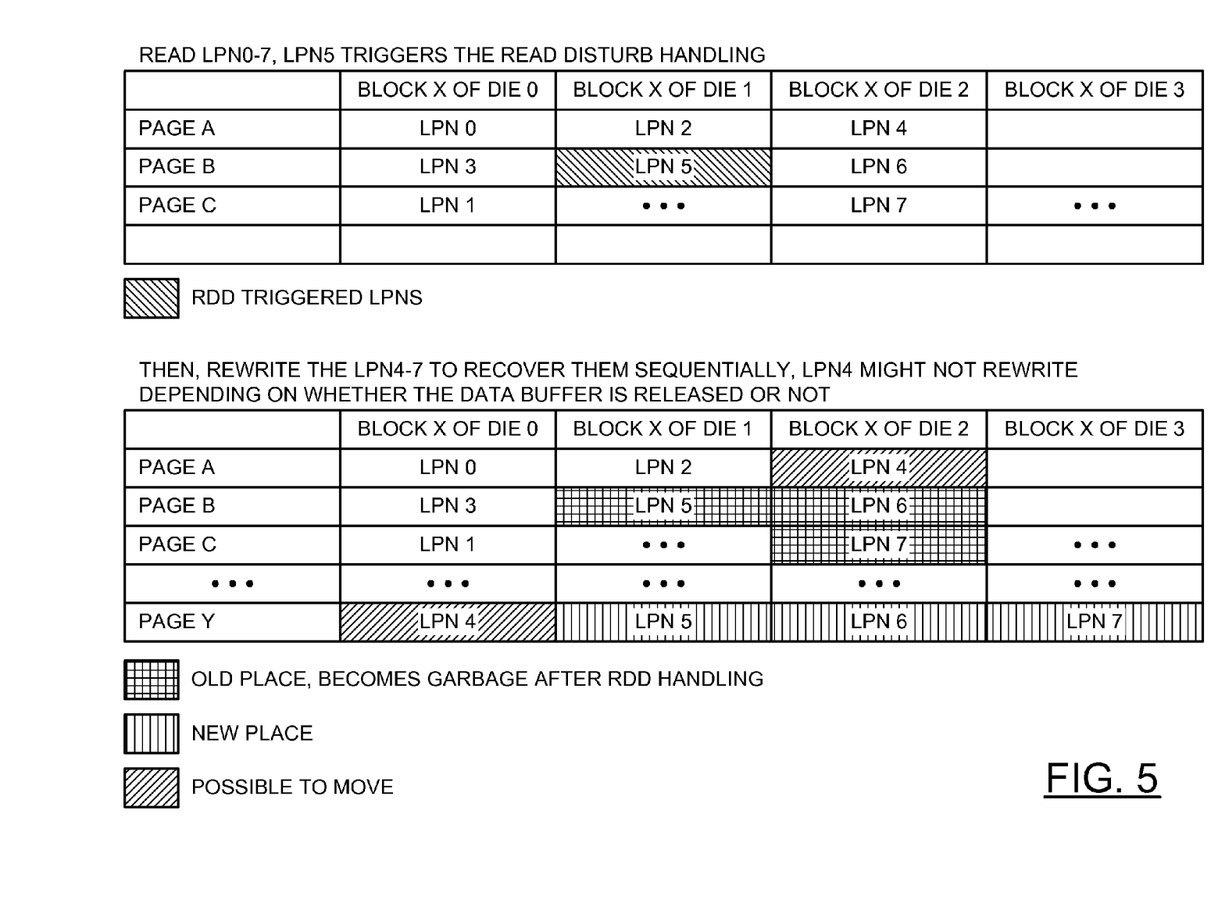
FIG. 5 is a diagram illustrating an example of a read disturb process.

Referring to FIG. 5, a diagram illustrating the various block replacements of the read disturb process is shown. The upper table shows how the original data is stored in the various blocks. The LPN0-7 are scattered in the physical layer. When a read command is received to read LPN0-7, the read of the LPN5 triggers the read disturb handling procedure. In the example shown, there are 4 modules 82a-82n. The LPN5 was stored within LPN4 and LPN7. The LPN0-3 is a group, the LPN4-7 is a group, the LPN8-11 is a group, and so on. The LPN5 will trigger a re-write of the LPN4-7. The data of the LPN4 may or may not be in the buffer 114. If the data is still in the buffer 114, the data is moved. If the data is no longer in the buffer 114, the data is not moved. The read for the LPN5-7 will happen after the trigger, so the data must be available to re-write. The lower table shows that the LPN4 may or may not be rewritten. The LPN5, LPN6, LPN7 will be moved to another physical layer to keep the data stored in a physically sequential manner.

Figure 6:
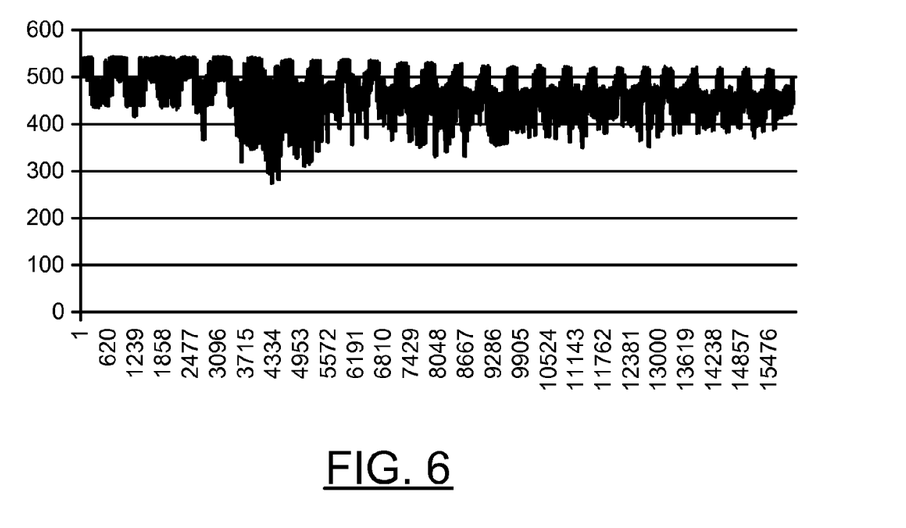
FIG. 6 is a diagram illustrating the performance of the read disturb process for data kept.

Referring to FIG. 6, a diagram illustrating the performance of the read disturb process is shown. In general, the performance is shown to be maintained at a relatively high level. The overall performance may be slightly reduced, since some bandwidth is used to process the read disturb module 104. However, such performance is not generally advantageous.

Figure 7:
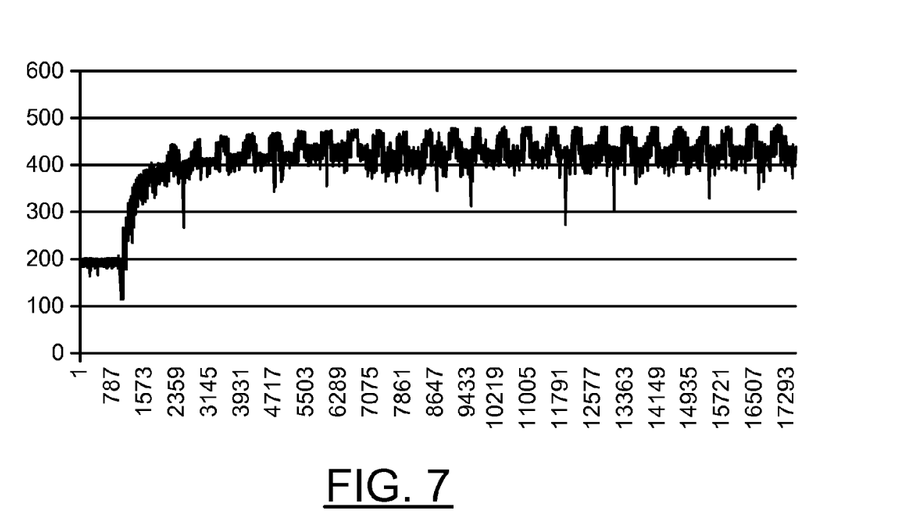
FIG. 7 is a diagram illustrating the performance of data recovered after a read disturb process.

Referring to FIG. 7, a diagram illustrating the performance of the data recovered after a read disturb process is shown. The performance is shown to gradually recover to a high level shortly after the read disturb is triggered. The graph in FIG. 7 shows a 128K sequential read command during a recovery period of approximately 10 seconds.

The controller 100 may be used to rewrite multiple sequential LPNs when a particular LPN triggers RDD handling. The expanded range is selected to be equal to or smaller than the host command boundary. The expanded range is selected to be equal to or smaller than the boundary of each of the modules 82a-82n. No additional reading is needed. For the LPNs which are read before the RDD triggers the LPN, if the buffers are not released, the data is rewritten. Otherwise, the data is reread and rewritten to the LPNs.

In general, the term read/write operation(s) may represent one or more operations to/from the memory 80. A typical read/write operation may include a read operation, a write operation, or a combination of one read operation and one write operation, with the read operation followed by a write operation.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The functions performed by the diagrams of FIGS. 3 and 4 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

While the invention has been particularly shown and described with reference to embodiments thereof, it will be understood by those skilled in the art that various changes in form and details may be made without departing from the scope of the invention.

The invention claimed is:

1. An apparatus comprising:
    a memory configured to store data, the memory comprising a plurality of memory modules; and
    a controller configured to process a plurality read/write operations to/from the memory, determine if a read disturb has occurred and if the read disturb has occurred determine a size of a group of read/write operations and write all of the group of read/write operations to one of the memory modules.

2. The apparatus according to claim 1, wherein the controller determines the size of the group of the read/write operations based on a head pointer and a tail pointer of the group of the read/write operations.

3. The apparatus according to claim 1, wherein the controller is further configured to determine a difference between the size of the group of read/write operations and a size of each of the memory modules.

4. The apparatus according to claim 3, wherein the controller is further configured to determine if the difference is below a predetermined value and write all of the group of read/write operations to one of the memory modules.

5. The apparatus according to claim 1, wherein the controller is further configured to override a wear leveling protocol.

6. The apparatus according to claim 1, wherein writing all of the group of read/write operations to one of the memory modules keeps the stored data physically sequential.

7. The apparatus according to claim 1, wherein the controller is further configured to record a read disturb count for each block of the memory modules, increment the read disturb count when the block is read and determine the read disturb has occurred when the read disturb count exceeds a predetermined threshold.

8. The apparatus according to claim 1, wherein the apparatus comprises a solid state drive (SSD).

9. A method for implementing a read disturb routine in a controller having an interface to a plurality of memory modules, comprising the steps of:
    determining if a read disturb has occurred;
    if the read disturb has not occurred, using unmodified read commands; and
    if the read disturb has occurred, determining a size of a group of read/write operations and writing all of the group of read/write operations to one of the memory modules.

10. The method according to claim 9, wherein the size of the group of the read/write operations is determined based on a head pointer and a tail pointer of the group of the read/write operations.

11. The method according to claim 10, further comprising the steps of:
    determining whether a size of the memory modules is greater than the size of the group of read/write operations; and
    writing all of the read/write operations to one of the memory modules if the size of the memory module is greater than the size of the group of read/write operations.

12. The method according to claim 9, further comprising the step of:
    overriding a wear leveling protocol.

13. An apparatus comprising:
    an interface configured to process a plurality of read/write operations to/from a memory; and
    a control circuit configured to determine if a read disturb has occurred and if the read disturb has occurred determine a size of a group of the read/write operations and write all of the group of read/write operations to one of a plurality of memory modules of the memory.

14. The apparatus according to claim 13, wherein the control circuit determines the size of the group of the read/write operations based on a head pointer and a tail pointer of the group of the read/write operations.

15. The apparatus according to claim 13, wherein the control circuit is further configured to determine a difference between the size of the group of the read/write operations and a size of each of the memory modules, determine if the difference is below a predetermined value and write all of the group of the read/write operations to one of the memory modules.

16. The apparatus according to claim 13, wherein the control circuit is further configured to override a wear leveling protocol.

17. The apparatus according to claim 13, wherein writing all of the group of the read/write operations to one of the memory modules keeps stored data physically sequential.

18. The apparatus according to claim 13, wherein the control circuit is further configured to record a read disturb count for each block of the memory modules, increment the read disturb count when the block is read and determine the read disturb has occurred when the read disturb count exceeds a predetermined threshold.

19. The apparatus according to claim 13, wherein the apparatus comprises a solid state drive (SSD) controller.

20. The apparatus according to claim 13, wherein the apparatus is configured to implement a host command based read disturb methodology.

* * * * *